(12) United States Patent
Liao et al.

(10) Patent No.: US 11,296,030 B2
(45) Date of Patent: Apr. 5, 2022

(54) EMBEDDED COMPONENT PACKAGE STRUCTURE AND MANUFACTURING METHOD THEREOF

(71) Applicant: ADVANCED SEMICONDUCTOR ENGINEERING, INC., Kaohsiung (TW)

(72) Inventors: Yu-Ju Liao, Kaohsiung (TW); Chien-Fan Chen, Kaohsiung (TW); Chien-Hao Wang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/397,530

(22) Filed: Apr. 29, 2019

(65) Prior Publication Data
US 2020/0343187 A1    Oct. 29, 2020

(51) Int. Cl.
H05K 3/46 (2006.01)
H01L 23/538 (2006.01)
H01L 21/48 (2006.01)

(52) U.S. Cl.
CPC ...... H01L 23/5384 (2013.01); H01L 21/4871 (2013.01); H01L 23/5383 (2013.01); H05K 3/4688 (2013.01)

(58) Field of Classification Search
CPC ............ H01L 23/5384; H01L 23/5383; H05K 3/4688
USPC .................. 257/774, E21.238, E23.011, 678; 438/629, 637, 639, 640, 667, 668, 672, 438/675, 700, 701, 713, 978, 106
See application file for complete search history.

(56) References Cited

U.S. PATENT DOCUMENTS

| 8,742,589 B2 | 6/2014 | Kawabata et al. |
| 2002/0009577 A1 | 1/2002 | Takaya et al. |
| 2002/0122934 A1 | 9/2002 | Takaya et al. |
| 2004/0113719 A1 | 6/2004 | Nakai et al. |
| 2004/0152426 A1 | 8/2004 | Suzuki et al. |

(Continued)

FOREIGN PATENT DOCUMENTS

| JP | 2001-118959 A | 4/2001 |
| JP | 2003-023009 A | 1/2003 |

(Continued)

OTHER PUBLICATIONS

Office Action for corresponding Japanese Patent Application No. 2019-118677, dated Dec. 1, 2020, 10 pages (includes English translation.

(Continued)

Primary Examiner — Didarul A Mazumder
(74) Attorney, Agent, or Firm — Foley & Lardner LLP (57) ABSTRACT

An embedded component package structure including a dielectric structure, a semiconductor chip, a first polymer layer, and a patterned conductive layer is provided. The semiconductor chip is embedded in the dielectric structure. The first polymer layer covers the semiconductor chip and has a first thickness, and the first thickness is greater than a second thickness of the dielectric structure above the first polymer layer. The patterned conductive layer covers an upper surface of the dielectric structure and extends over the first polymer layer, and the patterned conductive layer is electrically connected to the semiconductor chip.

18 Claims, 12 Drawing Sheets

(56) References Cited

U.S. PATENT DOCUMENTS

| | | | |
|---|---|---|---|
| 2004/0195686 A1* | 10/2004 | Jobetto | H01L 21/568 257/734 |
| 2004/0233644 A1 | 11/2004 | Ajioka et al. | |
| 2004/0233648 A1 | 11/2004 | Ajioka et al. | |
| 2005/0029642 A1 | 2/2005 | Takaya et al. | |
| 2006/0057341 A1 | 3/2006 | Kawabata et al. | |
| 2006/0202353 A1* | 9/2006 | Wakabayashi | H01L 24/97 257/780 |
| 2007/0052086 A1* | 3/2007 | Oi | H01L 24/24 257/698 |
| 2007/0057366 A1 | 3/2007 | Katsumata et al. | |
| 2007/0069363 A1 | 3/2007 | Kawabata et al. | |
| 2007/0076320 A1 | 4/2007 | Endo et al. | |
| 2007/0119541 A1 | 5/2007 | Kawabata et al. | |
| 2007/0141759 A1 | 6/2007 | Nagase et al. | |
| 2008/0055859 A1 | 3/2008 | Furukawa et al. | |
| 2008/0149379 A1 | 6/2008 | Nagase et al. | |
| 2008/0202803 A1 | 8/2008 | Nagase et al. | |
| 2008/0211086 A1 | 9/2008 | Morita | |
| 2008/0211143 A1 | 9/2008 | Morita | |
| 2009/0025965 A1 | 1/2009 | Kanemaru et al. | |
| 2009/0025971 A1 | 1/2009 | Kanemaru et al. | |
| 2009/0134490 A1 | 5/2009 | Furukawa et al. | |
| 2009/0211799 A1 | 8/2009 | Nagase et al. | |
| 2009/0218678 A1 | 9/2009 | Kawabata et al. | |
| 2009/0237059 A1 | 9/2009 | Chiba | |
| 2010/0013103 A1 | 1/2010 | Kawabata et al. | |
| 2010/0015795 A1* | 1/2010 | Kaneko | H01L 24/11 438/613 |
| 2010/0051189 A1 | 3/2010 | Kawabata et al. | |
| 2010/0083490 A1 | 4/2010 | Kawabata et al. | |
| 2010/0112804 A1* | 5/2010 | Kobayashi | H01L 21/6835 438/637 |
| 2010/0178737 A1 | 7/2010 | Kawabata et al. | |
| 2010/0246151 A1 | 9/2010 | Furukawa et al. | |
| 2010/0265632 A1 | 10/2010 | Saita et al. | |
| 2011/0234196 A1 | 9/2011 | Chiba | |
| 2012/0044652 A1 | 2/2012 | Horikawa et al. | |
| 2012/0153501 A1* | 6/2012 | Murai | H01L 23/5389 257/774 |
| 2012/0247819 A1 | 10/2012 | Tsuyutani et al. | |
| 2012/0285013 A1 | 11/2012 | Kanemaru et al. | |
| 2014/0085854 A1 | 3/2014 | Tsuyutani et al. | |
| 2014/0104803 A1 | 4/2014 | Tsuyutani | |
| 2014/0333274 A1 | 11/2014 | Abe et al. | |
| 2015/0002779 A1* | 1/2015 | Joten | G02F 1/133308 349/59 |
| 2015/0062809 A1 | 3/2015 | Yokoyama et al. | |
| 2015/0145145 A1 | 5/2015 | Tsuyutani et al. | |
| 2017/0025324 A1 | 1/2017 | Yamaki et al. | |
| 2017/0295643 A1 | 10/2017 | Suzuki et al. | |
| 2017/0317038 A1 | 11/2017 | Tsai et al. | |
| 2018/0014407 A1* | 1/2018 | Sato | H01L 23/5386 |
| 2018/0027660 A1 | 1/2018 | Yoshida et al. | |
| 2018/0132355 A1 | 5/2018 | Saita et al. | |
| 2018/0166427 A1 | 6/2018 | Chen et al. | |
| 2018/0233553 A1 | 8/2018 | Tomikawa et al. | |
| 2018/0235086 A1 | 8/2018 | Tomikawa et al. | |
| 2018/0337131 A1 | 11/2018 | Tsuyutani et al. | |

FOREIGN PATENT DOCUMENTS

| | | |
|---|---|---|
| JP | 2004-095836 A | 3/2004 |
| JP | 2011-091216 A | 5/2011 |
| JP | 2014-110337 A | 6/2014 |
| JP | 2015233160 A | 12/2015 |
| JP | 2017157681 A | 9/2017 |
| JP | 2018133363 A | 8/2018 |
| TW | 201739032 A | 11/2017 |
| TW | 201822329 A | 6/2018 |
| WO | 2018180628 A1 | 10/2018 |

OTHER PUBLICATIONS

Office Action for corresponding Taiwanese Patent Application No. 108124002, dated Dec. 15, 2021, 4 pages.

Search Report with English translation for corresponding Taiwanese Patent Application No. 108124002, dated Dec. 15, 2021, 2 pages.

* cited by examiner

EMBEDDED COMPONENT PACKAGE STRUCTURE AND MANUFACTURING METHOD THEREOF

BACKGROUND OF THE INVENTION

Field of the Invention

The invention relates in general to a component package structure and a manufacturing method thereof, and more particularly to an embedded component package structure and a manufacturing method thereof.

Description of the Related Art

In a system-level package structure, a semiconductor embedded in substrate (SESUB) technology that embeds a semiconductor chip into a package substrate has advantages of reduced noise interference upon a package structure as well as reduced a size of product, and has thus become a focus of research and development of manufacturers in the field. To enhance the yield rate of production, it is necessary to fix an embedded component in a dielectric structure of a circuit substrate to facilitate electrical connection between patterned conductive layers and the embedded component in subsequent process.

At present, the blind vias in the dielectric structure above the embedded component are completed by a sandblasting process. However, the depth of the blind via directly affects the size of opening (i.e., aperture), which causes the size of the opening cannot to be further reduced, and needs to be further solved.

SUMMARY OF THE INVENTION

It is therefore an object of the invention to provide an embedded component package structure and a manufacturing method thereof, which utilizes a polymer material to replace a dielectric structure above the embedded component, thereby reducing the thickness of the dielectric structure and thus reducing the size of the opening in subsequent sandblasting process.

According to one embodiment of the invention, an embedded component package structure including a dielectric structure, a semiconductor chip, a first polymer layer, and a patterned conductive layer is provided. The semiconductor chip is embedded in the dielectric structure. The first polymer layer covers the semiconductor chip and has a first thickness, and the first thickness is greater than a second thickness of the dielectric structure above the first polymer layer. The patterned conductive layer covers an upper surface of the dielectric structure and extends over the first polymer layer, and the patterned conductive layer is electrically connected to the semiconductor chip.

According to another embodiment of the invention, an embedded component package structure including a dielectric structure, a semiconductor chip, a first polymer layer, and a patterned conductive layer is provided. The semiconductor chip is embedded in the dielectric structure. The first polymer layer covers the semiconductor chip and has a first thickness, and the first thickness is greater than a second thickness of the dielectric structure correspondingly above the first polymer layer, wherein the first polymer layer has a first opening, the dielectric structure has a second opening, and the first opening is smaller than the second opening. The patterned conductive layer covers an upper surface of the dielectric structure and extends over the polymer layer and in the first opening and the second opening, and the patterned conductive layer is electrically connected to the semiconductor chip.

According to an alternative embodiment of the invention, a method of manufacturing an embedded component package structure is provided, including the following steps. A semiconductor chip is provided on a carrier, and the semiconductor chip includes a polymer layer. A dielectric structure is provided on the carrier to encapsulate the semiconductor chip, and the thickness of the polymer layer is greater than the thickness of the dielectric structure correspondingly above the polymer layer. A patterned conductive layer is formed on an upper surface of the dielectric structure and extends over the polymer layer.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE INVENTION

Details are given in the non-limiting embodiments below. It should be noted that the embodiments are illustrative examples and are not to be construed as limitations to the claimed scope of the present invention. The same/similar denotations are used to represent the same/similar components in the description below. Directional terms such as above, below, left, right, front or back are used in the following embodiments to indicate the directions of the accompanying drawings, not for limiting the present invention.

Please referring to FIGS. 1A to 10, which are partial schematic views of a sandblasting process for an embedded component package structure 10. First, a component 11 is provided and then embedded in a dielectric structure 16. The upper surface of the embedded component 11 is provided with a plurality of electrical pads 12, for example. The material of the dielectric structure 16 is, for example, a resin that is thermal curable to fix the component 11 in the dielectric structure 16. Next, the dielectric structure 16 is sandblasted to form a blind via 16a. Next, a conductive layer 17 is formed on the upper surface of the dielectric structure 16 and extends into the blind via 16a, and the conductive layer 17 is etched to form a patterned conductive layer 17a.

Figure 1A:
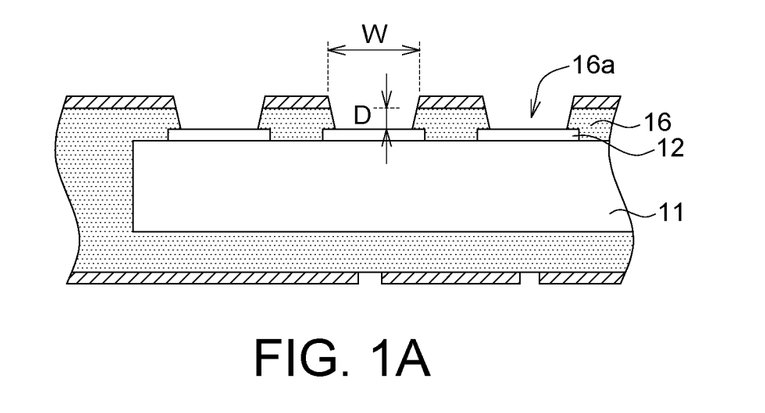
FIGS. 1A to 1C are partial schematic views showing a sandblasting process for the embedded component package structure.
Figure 1B:
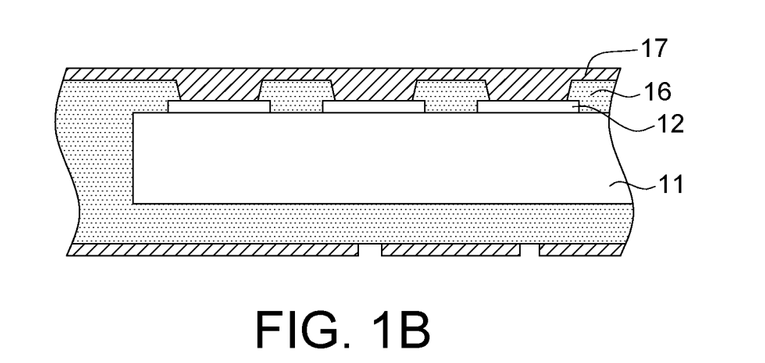
Figure 1C:
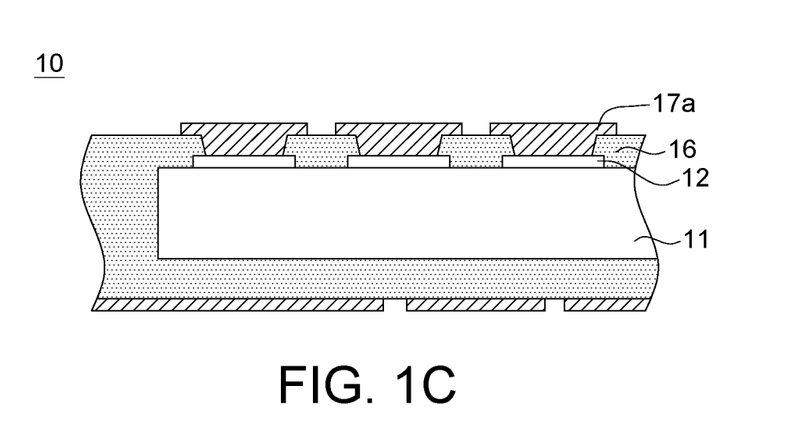

However, the thickness D of the dielectric structure 16 needs to be greater than 12 µm in order to have good press-fit uniformity, and the higher the thickness D of the dielectric structure 16, the more the number of sandblasting is required to form the blind via 16a. In addition, the greater the depth of the blind via 16a, the larger the aperture W of the blind via 16a is, so that the aperture W of the blind via 16a formed by the subsequent sandblasting process cannot be less than 40 µm, and the minimum size of the electrical pad 12 located under the blind via 16a is also impossible to be smaller than 60 µm, so that the spacing between the electrical pads 12 cannot be reduced.

According to an embodiment of the present invention, an embedded component package structure is provided, which can make the thickness of the dielectric structure above the embedded component less than a predetermined value and still have good press-fit uniformity. Since the thickness of the dielectric structure is relatively reduced, a relatively small number of sandblasting is required to form a blind via, and the aperture of the blind via is also relatively reduced.

Figure 2:
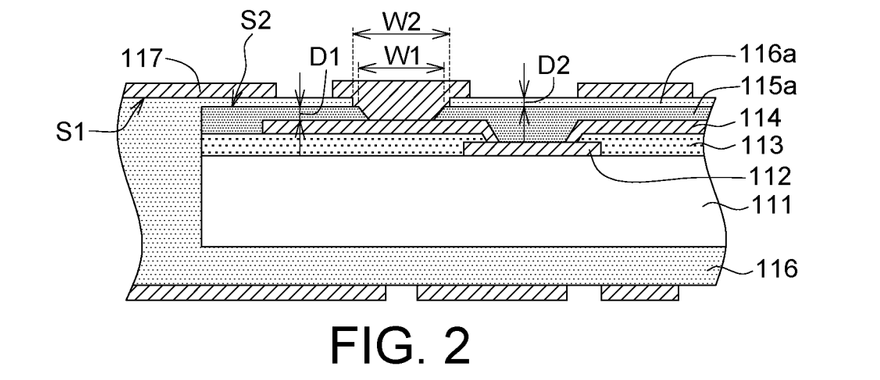
FIGS. 2 to 5 are partial cross-sectional views showing an embedded component package structure according to various embodiments of the present invention.

Referring to FIG. 2, the embedded component package structure 100 according to an embodiment of the present invention includes a semiconductor chip 111, a first polymer layer 115a, a dielectric structure 116, and a patterned conductive layer 117. The semiconductor chip 111 is embedded in the dielectric structure 116. The first polymer layer 115a covers the semiconductor chip 111 and has a first thickness D1. The first thickness D1 is greater than a second thickness D2 of the dielectric structure 116a above the first polymer layer 115a. Since the thickness of the dielectric structure 116a is smaller than the thickness of the first polymer layer 115a, the number of sandblasting required to form blind vias for the dielectric structure 116a can be reduced. The patterned conductive layer 117 covers an upper surface of the dielectric structure 116 and extends over the first polymer layer 115a. The patterned conductive layer 117 is electrically connected to the semiconductor chip 111. The dielectric structure 116 may be pressed on the semiconductor chip 111 by a semi-cured dielectric material (e.g., a resin) and cured by heat to form a dielectric structure 116. In order for the dielectric material to have good press-fit uniformity, the thickness of the film is, for example, greater than 12 µm, which may subsequently be sandblasted to reduce the thickness of the dielectric structure 116a (i.e., the second thickness D2) above the semiconductor chip 111.

In an embodiment, the semiconductor chip 111 includes at least one electrical pad 112 and an insulating layer 113, wherein the first polymer layer 115a is disposed on the top of the insulating layer 113, and the patterned conductive layer 117 can pass through the openings of the insulating layer 113 and the first polymer layer 115a and is electrically connected to the electrical pad 112. In addition, the semiconductor chip 111 has, for example, a redistribution layer 114 covering the top of the insulating layer 113 and disposed between the first polymer layer 115a and the insulating layer 113. The patterned conductive layer 117 can be electrically connected to the electrical pad 112 via the redistribution layer 114. The electrical pad 112 can be an aluminum pad or a copper pad, and the insulating layer 113 is, for example, silicon nitride or silicon oxynitride. The first polymer layer 115a is, for example, a cured photosensitive resin, and can be formed by exposure and development (photolithography process) to form a patterned opening, and is cured by heating. The above exposure and development process differs from the process of forming the openings of the dielectric structure 116 via sandblasting.

In an embodiment, the material of the first polymer layer 115a may be a photosensitive polyimide resin or a photosensitive acrylic resin, in which a photoinitiator having a high light absorption coefficient is blended with a crosslinking agent, so that a polymer layer having a high sensitivity and a low film thickness loss under low exposure energy can be obtained to facilitate forming of patterned openings.

In FIG. 2, the thickness of the first polymer layer 115a (i.e., the first thickness D1) is, for example, greater than 3 µm, less than 15 µm, and the thickness of the dielectric structure 116a above the first polymer layer 115a (i.e., the second thickness D2) is, for example, less than 4.5 µm, which is significantly reduced relative to the thickness of the dielectric structure 16 in FIG. 1A being greater than 12 µm. In the present embodiment, since the first polymer layer 115a is a photosensitive resin, the size of openings of the first polymer layer 115a depends on the ability of exposure to facilitate the formation of a smaller aperture W1. In addition, the sum of the first thickness D1 and the second thickness D2 is, for example, between 3 µm and 7.5 µm, but the invention is not limited thereto. When the sum of the first thickness D1 and the second thickness D2 is less than 3 µm, electrical insulation of resin is insufficient. When the sum of the first thickness D1 and the second thickness D2 is higher than 7.5 µm, the via depth is increased, which is disadvantageous for subsequent plating process. Therefore, the thickness of the dielectric structure 116a is preferably less than 4.5 microns, but is not limited thereto.

In the present embodiment, since the first polymer layer 115a is a photosensitive resin, the aperture W1 formed by exposure and development (lithography process) is relatively small (i.e., W1 is less than W2), and the thickness of the dielectric structure 116a is smaller than the thickness of the first polymer layer 115a, the aperture W2 subsequently formed in the dielectric structure 116a can be reduced accordingly, and the via depth (D1+D2) can be relatively reduced, so that the number of sandblasting and the sizes of the apertures W1 and W2 can be reduced to meet the requirement of a small aperture (about 20 µm).

Figure 3:
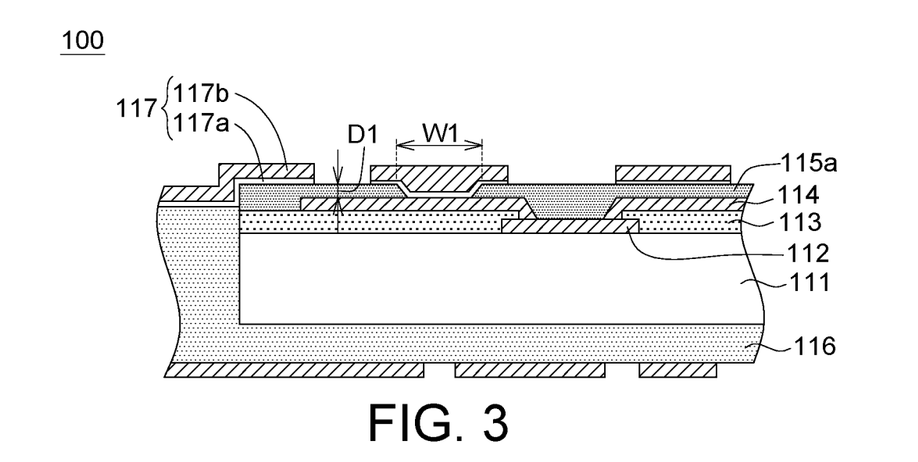

Please refer to FIG. 3, which shows an embedded component package structure 100 according to another embodiment of the present invention. The difference from the above embodiment is that there is no dielectric structure 116a above the first polymer layer 115a, so the thickness of the dielectric structure 116a (i.e., the second thickness D2) is zero. That is, the patterned conductive layer 117 directly covers the first polymer layer 115a. The patterned conductive layer 117 includes, for example, an electroless plated seed layer 117a and an electroplated copper layer 117b. The electroplated copper layer 117b may be overlaid on the electroless plated seed layer 117a and a patterned conductive layer 117 can be formed by partially etching the electroplated copper layer 117b and the seed layer 117a. The remaining components are the same as those described in the above embodiments, and are not repeated herein again.

Figure 4:
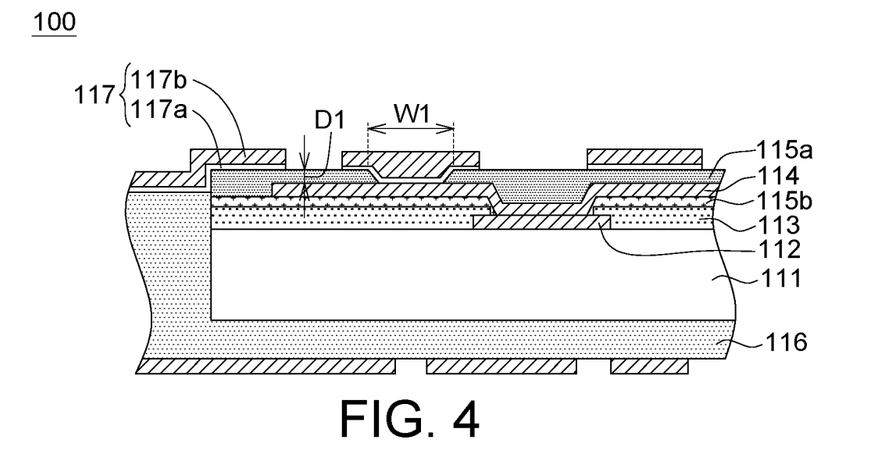

Please refer to FIG. 4, which shows an embedded component package structure 100 according to another embodiment of the present invention. The difference from the above two embodiments is that the present embodiment further includes a second polymer layer 115b, wherein the redistribution layer 114 is laminated between the first polymer layer 115a and the second polymer layer 115b, and the second polymer layers 115b are laminated between the redistribution layer 114 and the insulating layer 113. Compared with the embodiment having the dielectric structure 116a in FIG. 2, since the present embodiment does not need to form a blind via by sandblasting, and there are only blind vias formed in the first polymer layer 115a in advance, so that the via depth D1 and the aperture W1 can be further reduced to meet the requirement of a small aperture (about 20 μm).

Figure 5:
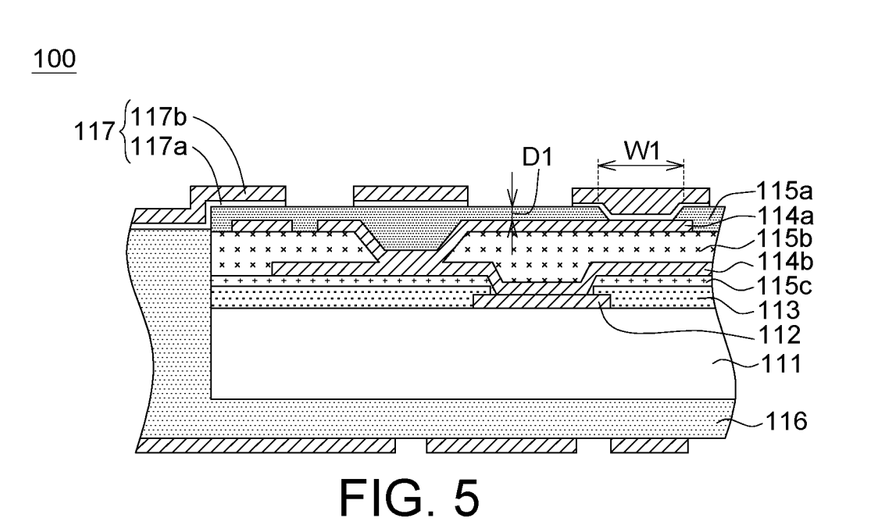

Please refer to FIG. 5, which shows an embedded component package structure 100 according to another embodiment of the present invention. The difference from the above three embodiments is that the present embodiment further includes a third polymer layer 115c, wherein the redistribution layer 114 can include a first redistribution layer 114a and a second redistribution layer 114b, the first redistribution layer 114a is overlapped between the first polymer layer 115a and the second polymer layer 115b, and the second polymer layer 115b is overlapped between the first redistribution layer 114a and the second redistribution layer 114b, and the third polymer layer 115c is overlapped between the second redistribution layer 114b and the insulating layer 113. The patterned conductive layer 117 can be electrically connected to the electrical pad 112 via the first redistribution layer 114a and the second redistribution layer 114b. Compared with the embodiment having the dielectric structure 116a in FIG. 2, since the present embodiment does not need to form a blind via by sandblasting, and there are only blind vias formed in the first polymer layer 115a in advance, so that the via depth D1 and the aperture W1 can be further reduced to meet the requirement of a small aperture (about 20 μm).

Figure 6A:
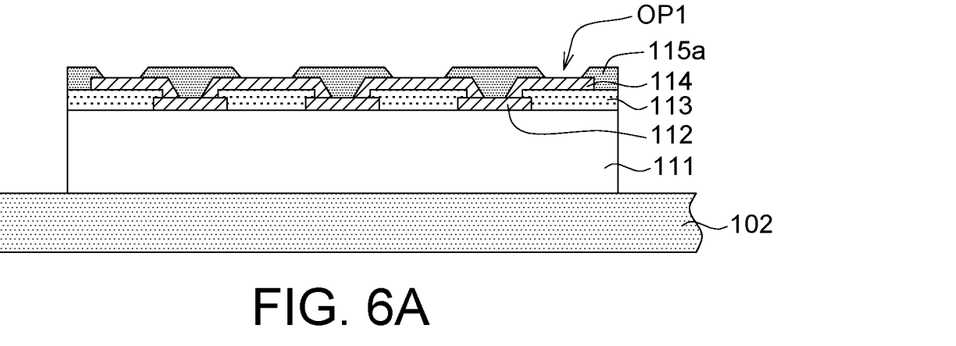
FIGS. 6A to 6D are flow diagrams showing a method of manufacturing an embedded component package structure according to an embodiment of the present invention.
Figure 6B:
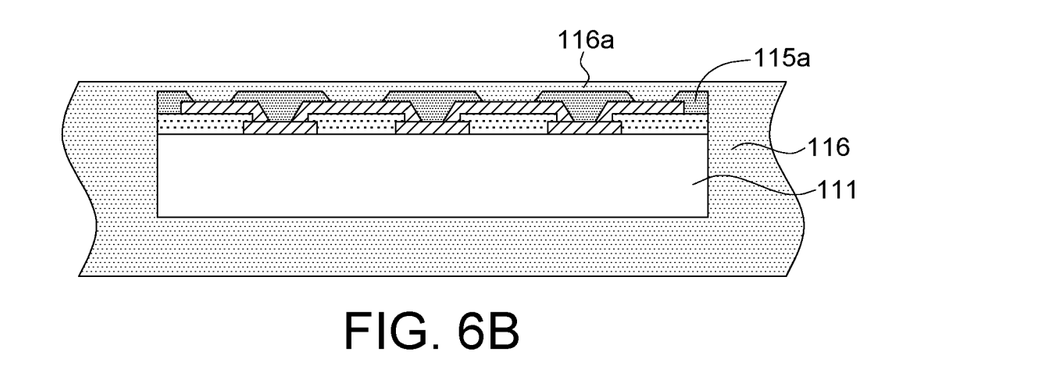
Figure 6C:
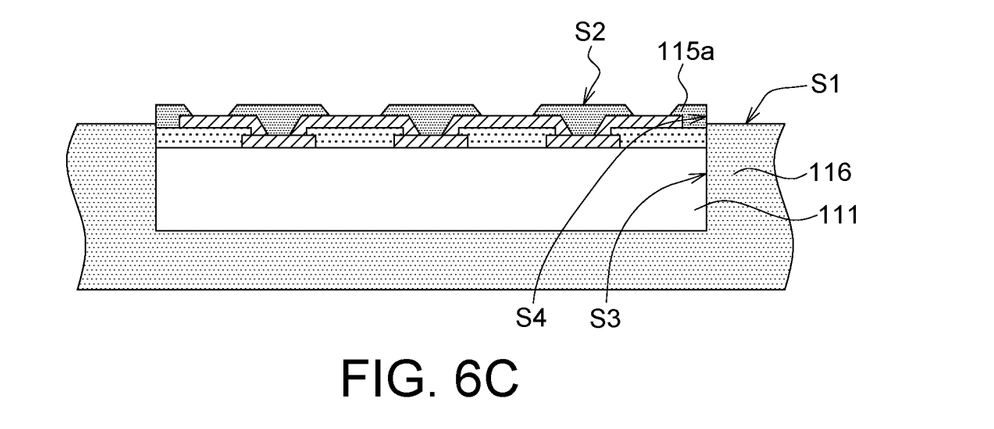

Referring to FIGS. 6A-6D, which are flow diagrams showing a method of manufacturing an embedded component package structure 110 according to an embodiment of the present invention. First, in FIG. 6A, a semiconductor chip 111 is provided on a carrier (not shown). The semiconductor chip 111 may include a first polymer layer 115a, a redistribution layer 114, and a plurality of electrical pads 112. The carrier can be a metal substrate that is formed with a dielectric material 102 in advance. Since the first polymer layer 115a is a photosensitive resin, the patterned opening (the first opening OP1) can be formed by exposure and development to expose the underlying redistribution layer 114 or the electrical pad 112. In FIGS. 6B and 6C, a dielectric structure 116 is provided on the carrier to encapsulate the semiconductor chip 111 and fill into the opening OP1 of the first polymer layer 115a, and a portion of the dielectric structure 116 may be removed by sandblasting or grinding to reduce the thickness of the dielectric structure 116a correspondingly above the first polymer layer 115a. Since the first polymer layer 115a has strong sandblast resistance with respect to the dielectric structure 116, the first polymer layer 115a is not easily removed by sandblasting than the dielectric structure 116a. In addition, the thickness of the dielectric structure 116a above the first polymer layer 115a is reduced, thereby relatively reducing the time and the number required for the sandblasting process.

In FIG. 6C, the upper surface S1 of the dielectric structure 116 may be lower than the upper surface S2 of the first polymer layer 115a. In another embodiment, as shown in FIG. 2, the upper surface S1 of the dielectric structure 116 may be higher or flush with the upper surface S2 of the first polymer layer 115a, which is not limited in the present invention. Further, the side surface S3 of the semiconductor chip 111 is substantially flush with the side surface S4 of the first polymer layer 115a regardless of the tolerance. That is, the first polymer layer 115a is first formed on the wafer-type semiconductor chip 111, and then the wafer is diced into a plurality of semiconductor chips 111 such that each of the semiconductor chips 111 has a flush first polymer layer 115a.

Figure 6D:
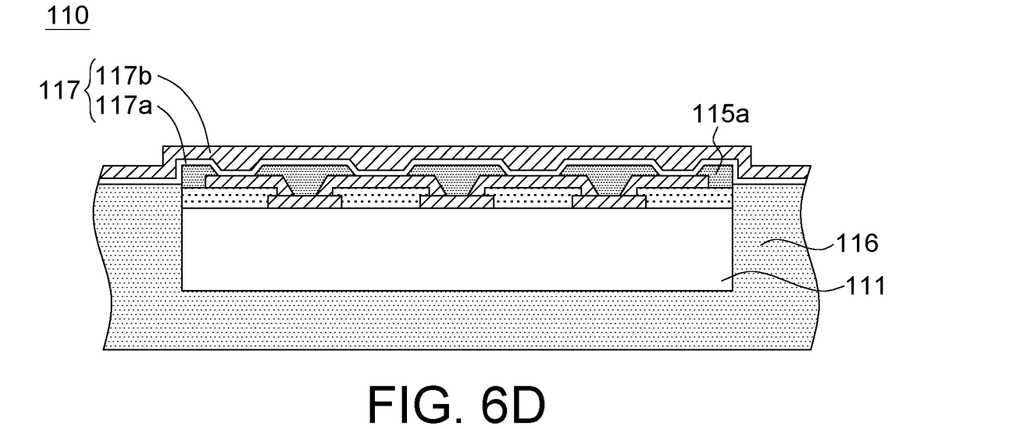

In FIG. 6D, a conductive layer 117 is formed on an upper surface of the dielectric structure 116 and extends over the first polymer layer 115a, including forming an electroless plated seed layer 117a on the upper surface of the dielectric structure 116, and forming an electroplated copper layer 117b on the seed layer 117a. The conductive layer 117 can be electrically connected to the redistribution layer 114. Thereafter, a portion of the conductive layer 117 is etched to form a patterned conductive layer 117 (as shown in FIG. 3).

Figure 7A:
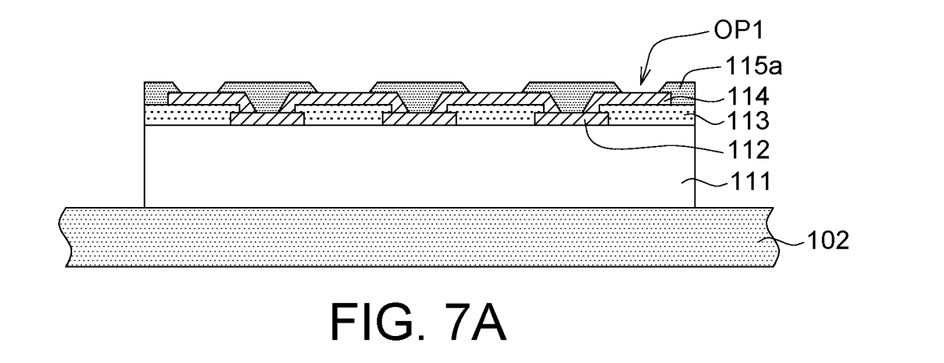
FIGS. 7A to 7G are flow diagrams showing a method of manufacturing an embedded component package structure according to another embodiment of the present invention.
Figure 7B:
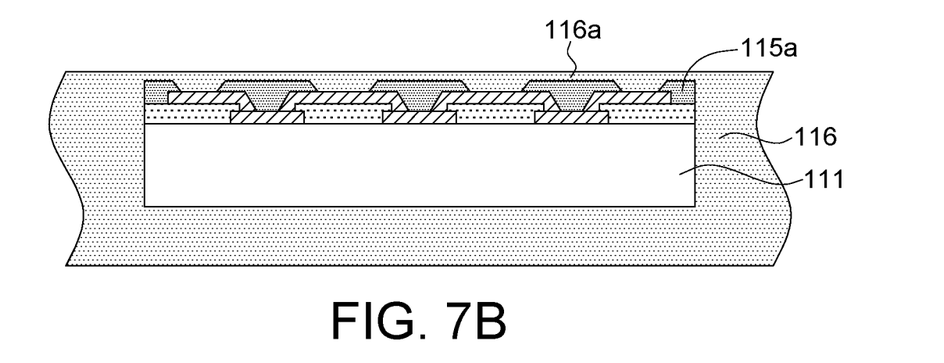
Figure 7C:
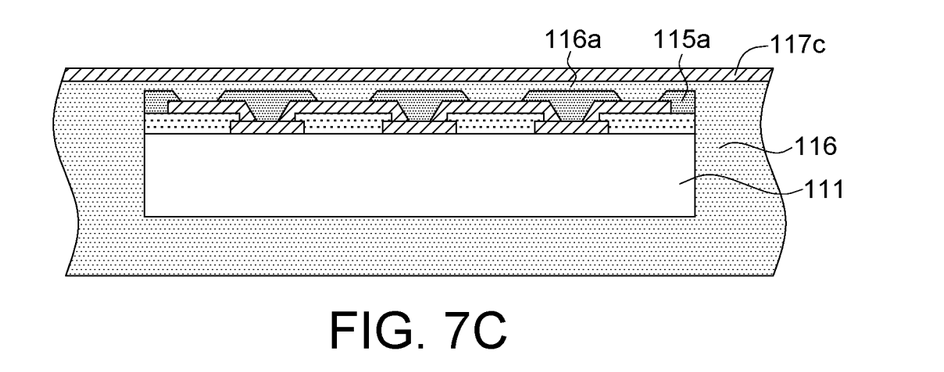
Figure 7D:
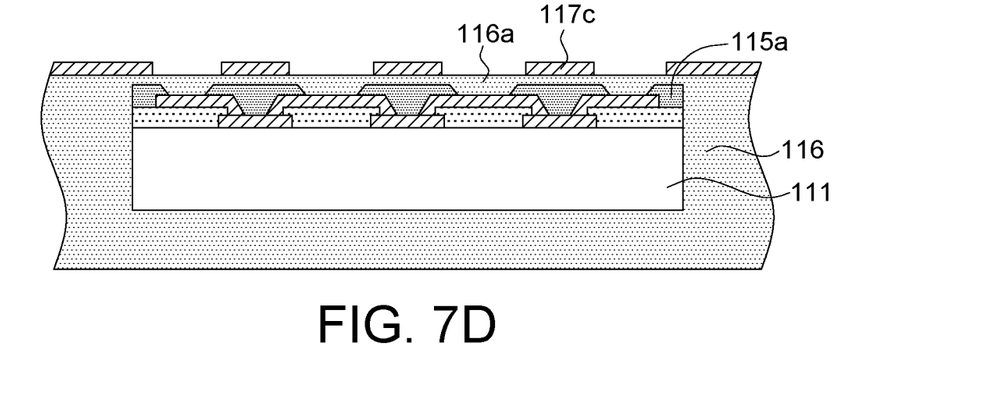
Figure 7E:
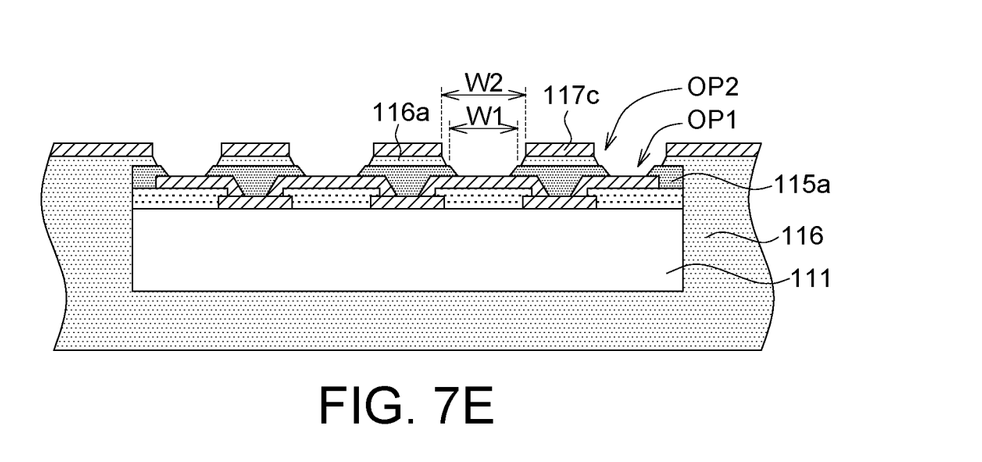

Please refer to FIGS. 7A-7G, which are flow diagrams showing a method of manufacturing an embedded component package structure 110 according to another embodiment of the present invention. This embodiment differs from the above embodiment in that, in FIG. 7C, a copper clad layer 117c (i.e., a copper foil) is pressed on the semi-cured dielectric structure 116, and the resin is cured by heat to fix the copper clad layer 117c onto the dielectric structure 116. Since the dielectric structure 116 has a better adhesion than the first polymer layer 115a, a dielectric structure 116a of a predetermined thickness (for example, 1 to 4.5 μm) is retained in the present embodiment to reinforce the copper clad layer 117c. Meanwhile, since the electroless plating seed layer 117a has poor adhesion to the dielectric structure 116a, it is necessary to additionally form the copper clad layer 117c as a bonding layer to allow the seed layer 117a to be smoothly formed on the dielectric structure 116a. The copper clad layer 117c may also allow subsequent electroplating process (referring to FIG. 7F) can be successfully completed. Next, in FIG. 7D, a patterned copper clad layer 117c is formed. In FIG. 7E, a portion of the dielectric structure 116 is removed such that the dielectric structure 116a above the first polymer layer 115a has a second opening OP2, and the second opening OP2 is greater than the first opening OP1 of the first polymer layer 115a. the step of removing the portion of the dielectric structure 116 includes removing the dielectric structure 116a located in the first opening OP1 of the first polymer layer 115a by sandblasting.

In the present embodiment, the dielectric structure 116a over the semiconductor chip 111 is replaced with a polymer material, thereby reducing the thickness of the dielectric structure 116a. In FIG. 7E, the first opening OP1 of the first polymer layer 115a has, for example, a first aperture W1, and the second opening OP2 of the dielectric structure 116 has, for example, a second aperture W2. The first aperture W1 is smaller than the second aperture W2, and the first opening OP1 and the second opening OP2 overlap each other on a vertical projection plane. In an embodiment, the wall at the first opening OP1 and the wall at the second opening OP2 are stepped so that the aperture is decreased from the second aperture W2 to the first aperture W1.

Figure 7F:
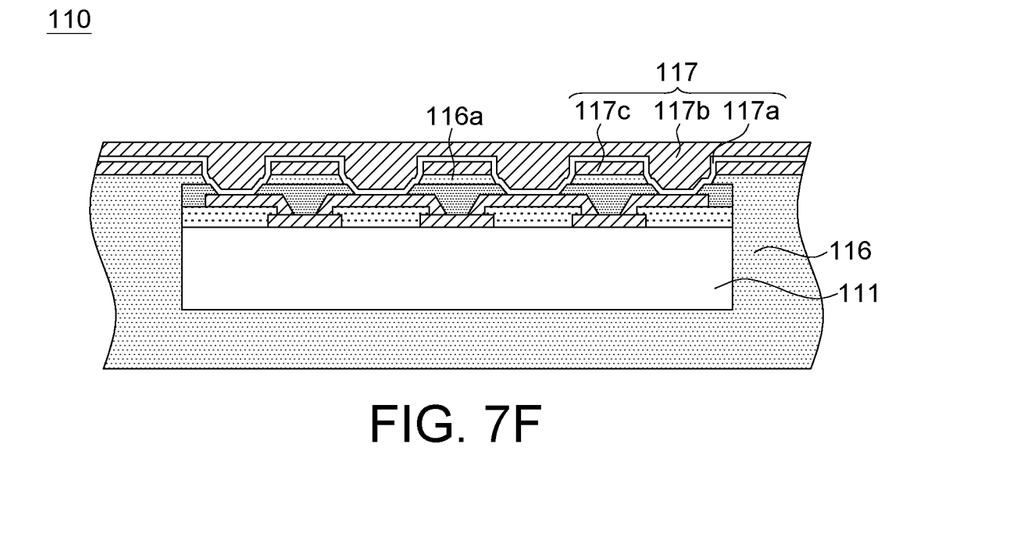
Figure 7G:
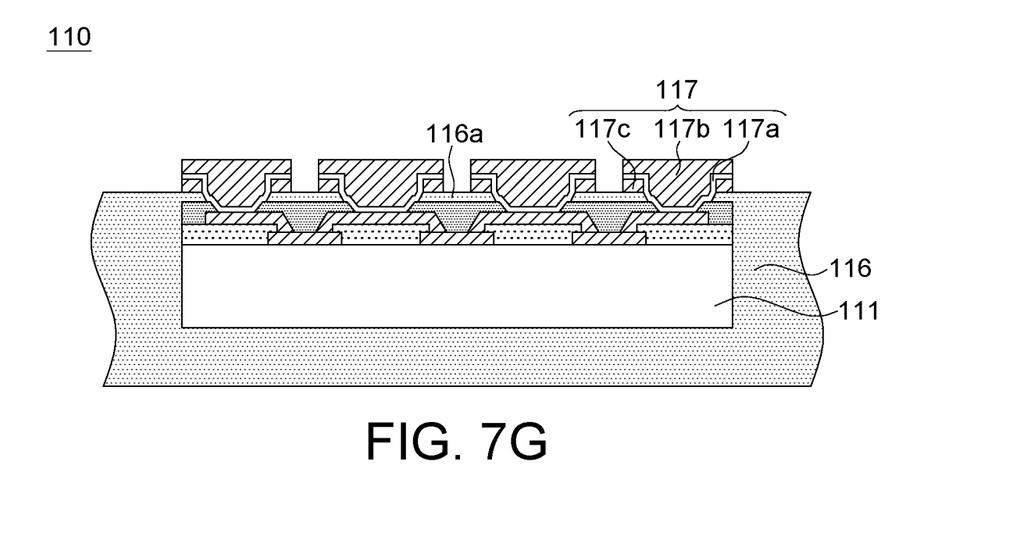

In FIG. 7F, an electroless plated seed layer 117a and an electroplated copper layer 117b are formed in the first opening OP1 and the second opening OP2, and are electrically connected to the copper clad layer 117c. Thereafter, a portion of the conductive layer 117 is etched to form a patterned conductive layer 117 (as shown in FIG. 7G). The remaining steps are as described in the above embodiments, and are not repeated herein again.

In FIG. 7G, as mentioned above, the patterned conductive layer 117 may include a copper clad layer 117c, an electroless plated seed layer 117a, and an electroplated copper layer 117b. The copper clad layer 117c may be pressed on the dielectric structure 116 and fixed to the dielectric structure 116 via heating. In addition, the electroplated copper layer 117b may be overlaid on the electroless plated seed layer 117a and electrically connected to the copper clad layer 117c to form the patterned conductive layer 117.

Figure 8A:
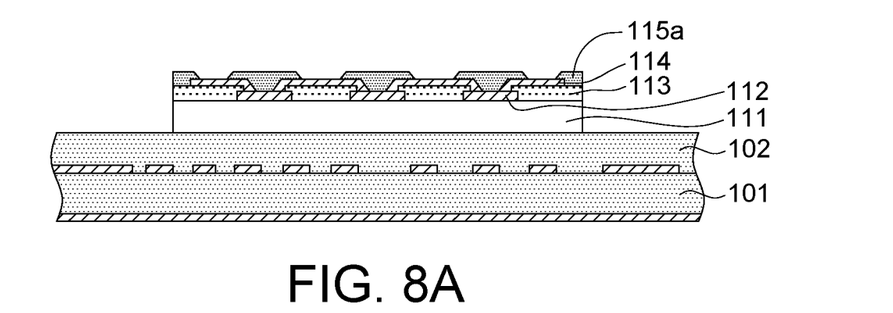
FIGS. 8A to 8J are flow diagrams showing a method of manufacturing an embedded component package structure according to an embodiment of the present invention.
Figure 8B:
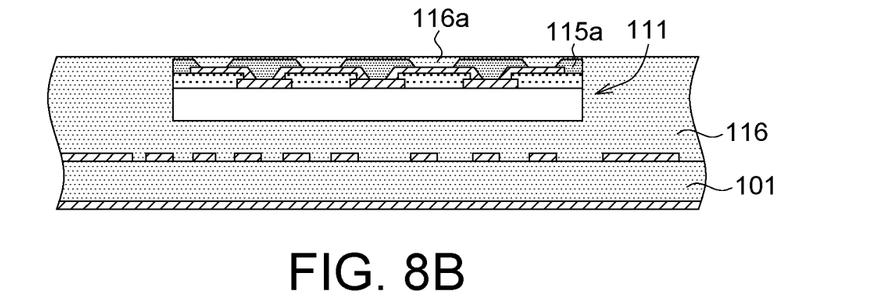
Figure 8C:
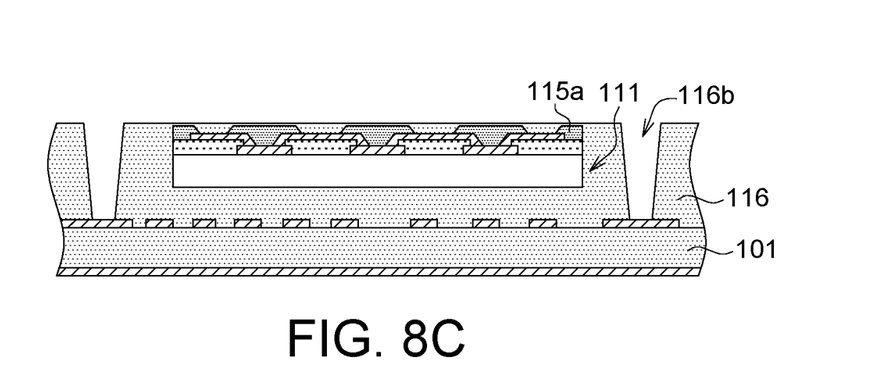
Figure 8D:
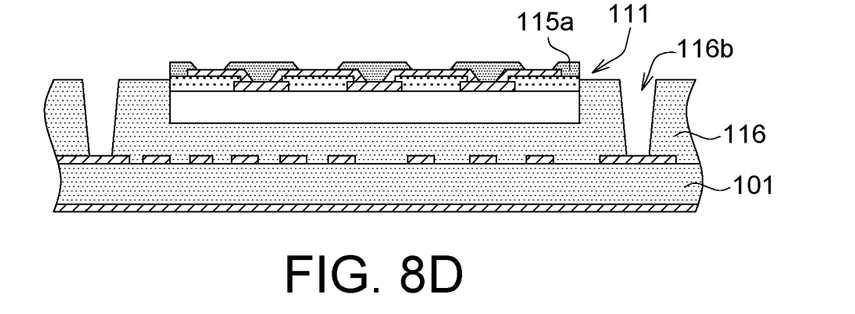
Figure 8E:
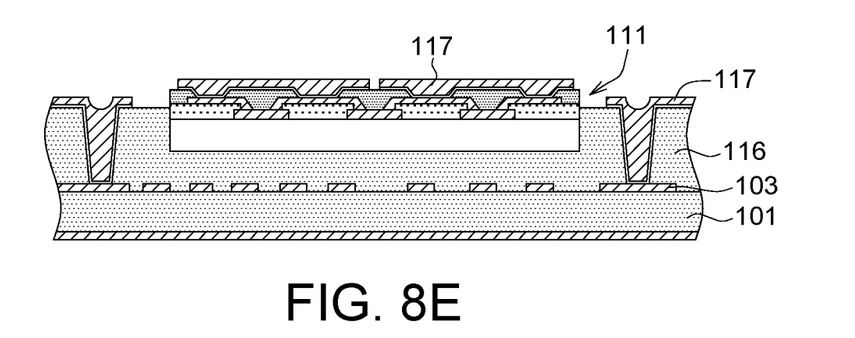
Figure 8F:
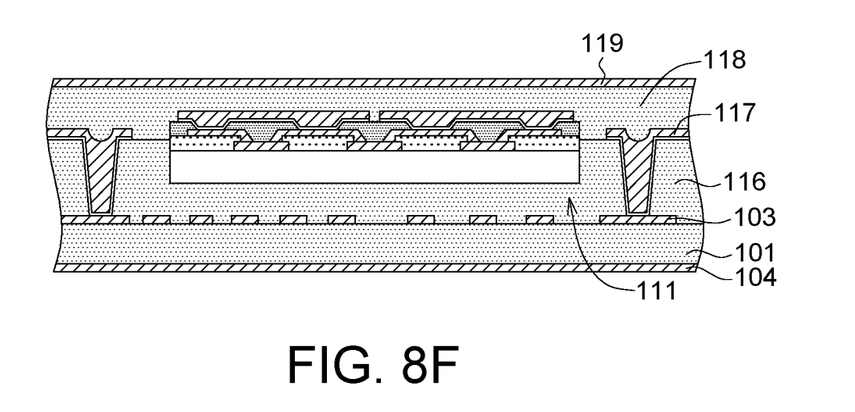
Figure 8G:
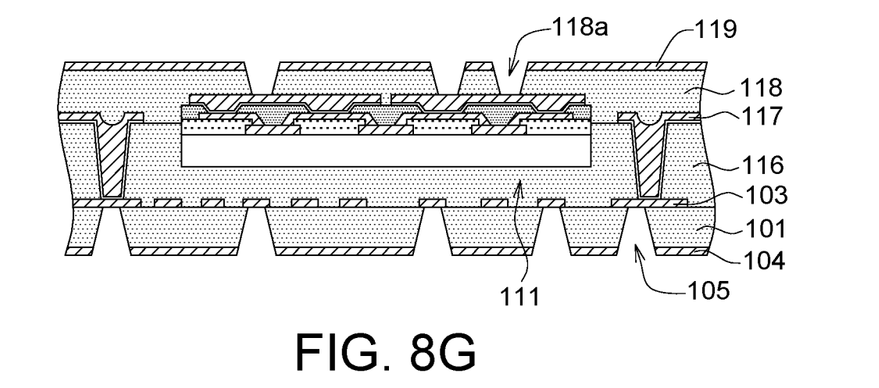
Figure 8H:
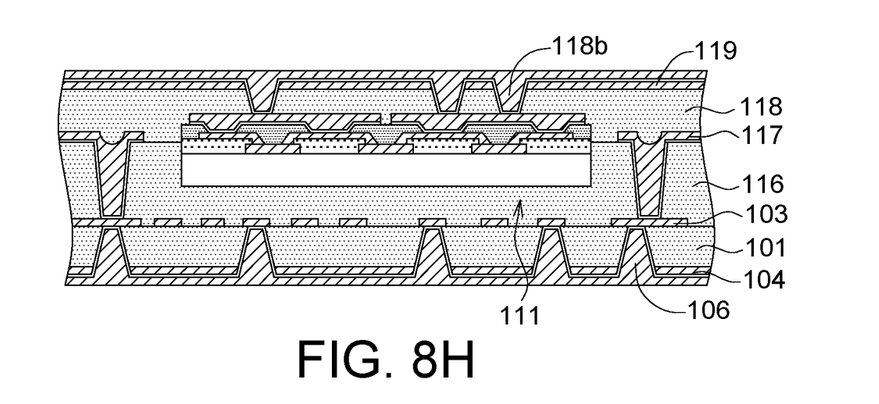

Please refer to FIGS. 8A-8J, which are flow diagrams showing a method of manufacturing an embedded component package structure 110 according to another embodiment of the present invention. The steps of FIGS. 8A-8B have been mentioned in the above embodiments for providing a semiconductor chip 111 on a carrier 101, covering the semiconductor chip 111 with a dielectric structure 116, and embedding the semiconductor chip 111 in the dielectric structure 116. The carrier 101 is, for example, a copper clad substrate. In FIG. 8C, at least one blind via 116b is formed in the dielectric structure 116 by sandblasting or etching. Then, in FIG. 8D, the dielectric structure 116a over the first polymer layer 115a is removed to make the thickness of the dielectric structure 116a (i.e., the second thickness D2) is equal to 0, or the thickness of the dielectric structure 116a (i.e., the second thickness D2) is retained and greater than 0 without removing the dielectric structure 116a over the first polymer layer 115a. Next, in FIG. 8E, an upper conductive layer 117 is formed on the upper surface of the dielectric structure 116, and the upper conductive layer 117 extends into the blind via 116b to become a conductive via electrically connected to the lower conductive layer 103. Next, in FIG. 8F, a dielectric layer 118 (e.g., a glass-containing resin) is formed on the dielectric structure 116, and another upper conductive layer 119 (e.g., a copper foil) is laminated on the dielectric layer 118. The resin is cured by heat so that the two upper conductive layers 117 and 119 are overlapped to each other. In FIG. 8G, a plurality of blind vias 118a are formed in the dielectric layer 118. Next, in FIG. 8H, an electroless plated seed layer is formed on the upper surface of the upper conductive layer 119 and the blind vias 118a, and then an electroplated copper layer is formed on the seed layer to electrically connect the two upper conductive layers 117 and 119 via the conductive vias 118b. In addition, in FIG. 8F, the carrier 101 may further include another lower conductive layer 104, and a patterned lower conductive layer 104 is formed by etching the lower conductive layer 104. In FIG. 8G, a plurality of blind vias 105 is formed In the carrier 101 by sandblasting. Next, in FIG. 8H, an electroless plated seed layer is formed on the lower conductive layer 104 and in the blind via 105, and an electroplated copper layer is formed on the seed layer to make the two lower conductive layers 103 and 104 are electrically connected via the conductive vias 106.

Figure 8I:
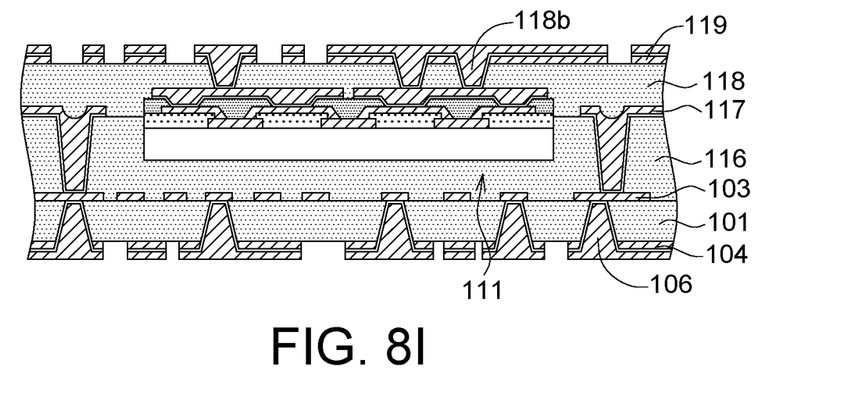
Figure 8J:
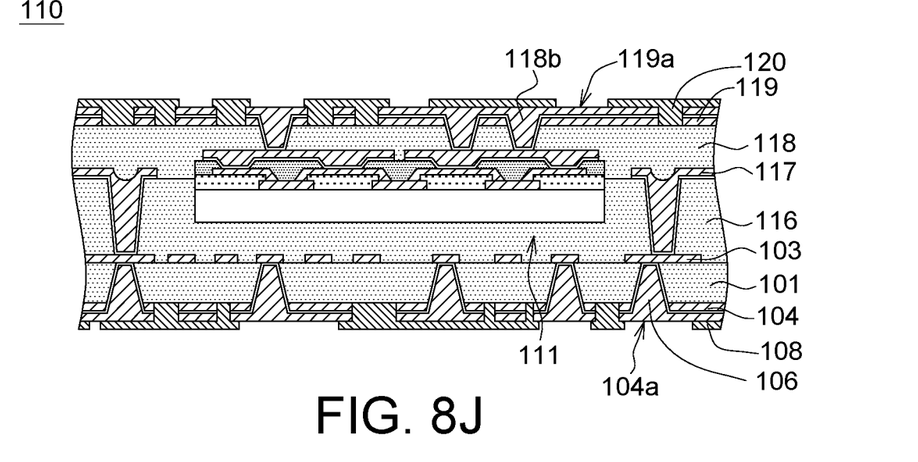

In FIG. 8I, a patterned upper conductive layer 119 and a patterned lower conductive layer 104 are formed by etching, and then, in FIG. 8J, a patterned first solder mask layer 120 is formed on the patterned upper conductive layer 119 and exposes a portion of the upper conductive layer 119 as a plurality of first bonding pads 119a and a patterned second solder mask layer 108 is formed on the patterned lower conductive layer 104 and exposes a portion of the lower conductive layer 104 as a plurality of second bonding pads 104a.

According to the above embodiments of the present invention, since a polymer layer is formed on the semiconductor chip in advance to replace a dielectric structure above the semiconductor chip, thereby reducing the thickness of the dielectric structure, and the depth of the blind via can be relatively reduced. Therefore, the number of sandblasting and the size of the aperture can be reduced to meet the requirements of a small aperture (about 20 μm). In addition, in the above embodiments, the polymer layer can be formed with a patterned opening in advance, which can reduce the cost of etching the polymer layer later by laser, and can avoid the subsequent removal of the dielectric structure and the polymer layer by sandblasting at the same time. Because the destructive force of sandblasting on the dielectric structure is greater than the destructive force on the polymer layer, the operation time of sandblasting would be elongated and the copper surface quality of the conductive layer is affected when the dielectric structure and the polymer layer are removed at the same time.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An embedded component package structure, comprising:
   a dielectric structure made of a single piece;
   a semiconductor chip embedded in the dielectric structure;
   a first polymer layer covering the semiconductor chip; and
   a patterned conductive layer covering the dielectric structure and extending over the first polymer layer, wherein the patterned conductive layer extends into an opening of the first polymer and is electrically connected to the semiconductor chip,
   wherein the patterned conductive layer includes a step structure in contact with an upper surface of the dielectric structure and an upper surface of the first polymer layer.

2. The embedded component package structure according to claim 1, wherein the first polymer layer is a cured photosensitive resin.

3. The embedded component package structure according to claim 1, wherein a side surface of the semiconductor chip is aligned with a side surface of the first polymer layer.

4. The embedded component package structure according to claim 1, wherein the semiconductor chip comprises at least one electrical pad and an insulating layer, and the insulating layer partially covers the at least one electrical pad.

5. The embedded component package structure according to claim 4, further comprising a redistribution layer disposed on and in contact with the at least one electrical pad and the insulating layer of the semiconductor chip, wherein the redistribution layer is covered by the patterned conductive layer and the patterned conductive layer is electrically connected to the semiconductor chip through the redistribution layer.

6. The embedded component package structure according to claim 4, wherein an upper surface of the dielectric structure is higher than an upper surface of the insulating layer by a second thickness, and a first thickness of the first polymer layer is greater than the second thickness.

7. The embedded component package structure according to claim 1, wherein a bottom surface of the semiconductor chip is in contact with the dielectric structure.

8. The embedded component package structure according to claim 1, wherein the dielectric structure is in contact with lateral surfaces of the semiconductor chip and the first polymer layer.

9. The embedded component package structure according to claim 1, wherein an upper surface of the dielectric structure is lower than an upper surface of the first polymer layer.

10. The embedded component package structure according to claim 1, wherein the patterned conductive layer is in contact with a side surface of the first polymer layer.

11. An embedded component package structure, comprising:
a dielectric structure;
a semiconductor chip embedded in the dielectric structure;
a first polymer layer covering the semiconductor chip; and
a first patterned conductive layer being in contact with an upper surface of the dielectric structure and an upper surface and a lateral surface of the first polymer layer and extending over the first polymer layer, and the first patterned conductive layer being electrically connected to the semiconductor chip.

12. The embedded component package structure according to claim 11, wherein a side surface of the semiconductor chip is aligned with a side surface of the first polymer layer.

13. The embedded component package structure according to claim 12, wherein the semiconductor chip comprises at least one electrical pad and an insulating layer between the at least one electrical pad and the first polymer layer, and the insulating layer partially covers the at least one electrical pad.

14. The embedded component package structure according to claim 13, wherein a side surface of the insulating layer is aligned with a side surface of the first polymer layer.

15. The embedded component package structure according to claim 14, wherein the dielectric structure is in contact with the side surface of the semiconductor chip and the side surface of the first polymer layer.

16. The embedded component package structure according to claim 15, wherein a portion of the side surface of the first polymer layer is exposed by the dielectric structure.

17. The embedded component package structure according to claim 11, wherein a bottom surface of the semiconductor chip is covered by the dielectric structure, and a second patterned conductive layer is disposed on a bottom surface of the dielectric structure, and the dielectric structure is sandwiched between the semiconductor chip and the second patterned conductive layer.

18. An embedded component package structure, comprising:
a dielectric structure made of a single piece;
a semiconductor chip embedded in the dielectric structure;
a first polymer layer covering the semiconductor chip; and
a patterned conductive layer covering the dielectric structure and extending over the first polymer layer, wherein the patterned conductive layer extends into an opening of the first polymer and is electrically connected to the semiconductor chip,
wherein the patterned conductive layer covers an upper surface of the dielectric structure, an upper surface and a lateral surface of the first polymer layer.

* * * * *